United States Patent [19]

Lurie et al.

[11] Patent Number: 5,578,922
[45] Date of Patent: Nov. 26, 1996

[54] METHOD OF CONTAINING IMAGES REPRESENTING THE DISTRIBUTION OF PARAMAGNETIC MATERIAL IN SOLUTION

[75] Inventors: David J. Lurie, Cults, England; John R. Mallard, Aberdeen, Scotland; Ian Nicholson, Dunstan, England

[73] Assignee: British Technology Group Limited, London, England

[21] Appl. No.: 382,004

[22] PCT Filed: Aug. 5, 1993

[86] PCT No.: PCT/GB93/01652

§ 371 Date: Feb. 3, 1995

§ 102(e) Date: Feb. 3, 1995

[87] PCT Pub. No.: WO94/03824

PCT Pub. Date: Feb. 17, 1994

[30] Foreign Application Priority Data

Aug. 5, 1992 [GB] United Kingdom .................. 9216597

[51] Int. Cl.$^6$ ................................................. G01V 3/00
[52] U.S. Cl. ................................................. 324/307; 324/309
[58] Field of Search ................................. 324/300, 306, 324/307, 309, 312, 316

[56] References Cited

U.S. PATENT DOCUMENTS

| | | | |
|---|---|---|---|
| 4,891,593 | 1/1990 | Lurie et al. | 324/307 |
| 4,984,573 | 1/1991 | Leunbach | 324/309 |
| 5,111,145 | 5/1992 | Sepponen | 324/316 |
| 5,203,332 | 4/1993 | Leunbach | 324/309 |
| 5,314,681 | 5/1994 | Leunbach et al. | 324/307 |

FOREIGN PATENT DOCUMENTS

| | | |
|---|---|---|
| WO90/13047 | 11/1990 | European Pat. Off. . |
| 0409292 | 1/1991 | European Pat. Off. . |
| 2252244 | 8/1992 | United Kingdom . |
| 2252245 | 8/1992 | United Kingdom . |
| 9204640 | 3/1992 | WIPO . |

OTHER PUBLICATIONS

Journal of Magnetic Resonance, vol. 94, No. 1, 1 Aug. 1991, Orlando, MN U.S. pp. 197–203, D. J. Lurie et al "EPR Spectral Information Obtained From Field–Cycled Proton–Electron Double–Resonance Images".

Journal of Magnetic Resonance, vol. 84, No. 2, 1 Sep. 1989, Orlando, MN US, pp. 431–437, D. J. Lurie et al "Field-–Cycled Proton–Electron Double–Resonance Imaging Of Free Radicals In Large Aqueous Samples".

F. Noack, "Progress In Nuclear Magnetic Resonance Spectroscopy", MNR Field–Cycling Spectroscopy: Principles and Applications, vol. 18, Part 3, pp. 171–276 (1986).

Primary Examiner—Louis M. Arana
Attorney, Agent, or Firm—Cushman, Darby & Cushman

[57] ABSTRACT

The invention provides a method of proton-electron double-resonance magnetic resonance imaging in which a sample containing paramagnetic material is subjected to a polarizing magnetic field during a polarization period, a subsequent evolution period and thereafter a detection period, and the sample is subjected during the evolution period to radio-frequency radiation, at a frequency appropriate to the polarizing magnetic field then appertaining, so as to excite EPR resonance in the paramagnetic material, wherein during the detection period the sample is subjected to a series of NMR interrogating signals to derive therefrom a corresponding series of NMR image signals for combination in a complete NMR image.

Preferably, the method according to the invention incorporates the technique of field cycling and the polarizing magnetic field is reduced from a first steady value during the polarization period to have a second, lower, value during the evolution period, being thereafter increased to have a value greater than the second value (and preferably equal to or less than the first value) during the detection period.

7 Claims, 3 Drawing Sheets

METHOD OF CONTAINING IMAGES REPRESENTING THE DISTRIBUTION OF PARAMAGNETIC MATERIAL IN SOLUTION

FIELD OF THE INVENTION

This invention relates to a method of obtaining images representing the distribution of paramagnetic material in solution, including free radicals. The invention has application inter alia in the determination of the distribution of free radicals, which may have been previously injected, in living tissue.

BACKGROUND OF THE INVENTION

Electron paramagnetic resonance (EPR) imaging using methods analogous to those employed in nuclear magnetic resonance (NMR) imaging but at much higher nutation frequencies is known. However, in view of the strong magnetic field gradients necessary to achieve good spatial resolution, EPR imaging has so far been restricted to small samples.

It is also known that if nuclei of a solvent in which paramagnetic material is dissolved are excited to nuclear magnetic resonance and the NMR resonance is observed, a dramatic enhancement of the observed NMR signal may be obtained if the paramagnetic material is simultaneously excited to EPR resonance. This phenomenon, known as Proton-Electron Double-Resonance Imaging (PEDRI), may be utilized to obtain image information regarding the spatial distribution of paramagnetic material in solution, and our U.S. Pat. No. 4,891,593 (the contents of which are incorporated herein by this reference to it) discloses a method of obtaining image information representing the distribution of paramagnetic material in solution which comprises the steps of applying radio-frequency radiation to excite EPR resonance in the solute and obtaining an NMR image signal of selected nuclei preferably protons) of the solvent, the signal from those selected nuclei which interact with electrons excited by the rf radiation being enhanced.

As will be understood, the solution to which this method is applied may be inhomogenously distributed in a sample, of living tissue, for example, and the enhanced parts of the obtained NMR image then represent the spatial distribution of the paramagnetic material within the tissue sample.

The NMR signal enhancement, which occurs in regions of the sample where paramagnetic material is present and influences the NMR proton relaxation rate, and which appears in the final image as a locally increased intensity of the image, may be defined as $E=A_z/A_o$, where $A_z$ and $A_o$ are the NMR signals with and without EPR irradiation. It is known that E depends on the concentration of the paramagnetic solute and on the square of the EPR irradiation radiofrequency magnetic field which is in turn proportional to the power of the EPR irradiation. If the conductivity of the sample is assumed to be constant, the power of the EPR irradiation required to produce a given value of E can be shown to be proportional to the square of the EPR irradiation frequency.

Since a proportion of the applied radiofrequency power is always absorbed by the sample, it is desirable to minimize the applied power while maintaining a detectable enhancement. Thus it is desirable to use as low a value of the polarizing magnetic field $B_o$ as possible, since the EPR frequency is proportional to the $B_o$ NMR magnetic field. Considering the signal-to-noise ratio (SNR) of the NMR image, however, it is known that the SNR decreases rapidly with decreasing $B_o$. Thus the value of $B_o$ should be maximized to optimize the SNR, which will in turn improve the sensitivity of detection of the paramagnetic species. Thus there are, apparently, conflicting requirements applying to selection of the value of $B_o$.

In our pending international patent application WO 92/04640 (the contents of which are incorporated herein by this reference to it) we have described how these apparently conflicting requirements as to the magnitude of the NMR magnetic field $B_o$ can both be satisfied and the apparent conflict resolved, by obtaining the NMR signal by use of the NMR method known as magnetic field cycling NMR. The magnetic field cycling NMR method, which is known as a method of studying NMR relaxation and other phenomena at extremely low field strengths (F. Noack, Prog. NMR Spectrosc. 18. 171(1986)), has three distinct periods during each of which $B_o$ may have a different value: polarization at $B_o^p$ (high field), evolution at $B_o^e$ (low field) and detection at $B_o^d$ (intermediate or high field); and, as disclosed in the said international application, the EPR irradiation magnetic field for exciting EPR resonance, and thereby enhancing the NMR signals from nuclei which interact with the excited electrons of the paramagnetic material, is applied only during the evolution period of each cycle, when the $B_o^e$ field value is low and the required frequency and power of the EPR irradiation are correspondingly low.

This method, combining the PEDRI double-resonance method with the field-cycling method, can effectively minimise the total of RF energy which the object under examination will absorb during each NMR excitation; but in using the method to produce a PEDRI-NMR image having 32×32 pixels at least 32 periods of EPR irradiation are required and each of these periods of RF irradiation contributes to the total energy absorbed by the object under examination. It is always desirable to obtain as high an enhancement of the NMR signal as possible, in order to improve the sensitivity of PEDRI for the detection of low concentrations of free radicals, so that in general as high an RF power as is tolerable will be used. Thus, in many cases, the ultimate sensitivity will be limited by the permissible applied power level. One way of reducing the average applied power is simply to extend the time duration of each imaging pulse sequence thus decreasing the duty cycle of the RF irradiation, but this may well increase the total imaging time to beyond acceptable limits, particularly if images with 128×128 or 256×256 pixels are being collected.

SUMMARY OF THE INVENTION

It is an object of the present invention to provide a method in which the average applied RF power may be reduced, and this object is achieved by providing that in the NMR detection period which follows a single EPR excitation period a plurality of NMR interrogation signals are applied to the object under examination and a corresponding plurality of NMR image signals are obtained.

Preferably this multiple NMR-interrogation version of the PEDRI method is combined with the field-cycling NMR method referred to above.

According to the invention, therefore, there is provided a method of proton-electron double-resonance magnetic resonance imaging in which a sample containing paramagnetic material is subjected to a polarizing magnetic field during a polarization period, a subsequent evolution period and thereafter a detection period, and the sample is subjected during the evolution period to radio-frequency radiation, at a frequency appropriate to the polarizing magnetic field then appertaining, so as to excite EPR resonance in the paramagnetic material, wherein during the detection period the sample is subjected to a series of NMR interrogating signals to derive therefrom a corresponding series of NMR image signals for combination in a complete NMR image.

Preferably, the method incorporates the technique of field cycling and the polarizing magnetic field is reduced from a first steady value during the polarization period to have a second, lower, value during the evolution period, being thereafter increased to have a value greater than the second value (and preferably equal to or less than the first value) during the detection period.

BRIEF DESCRIPTION OF THE DRAWINGS

The method according to the invention will be more fully explained in the following description with reference to the accompanying drawings, in which.

DESCRIPTION OF PREFERRED EMBODIMENTS

Figure 1:
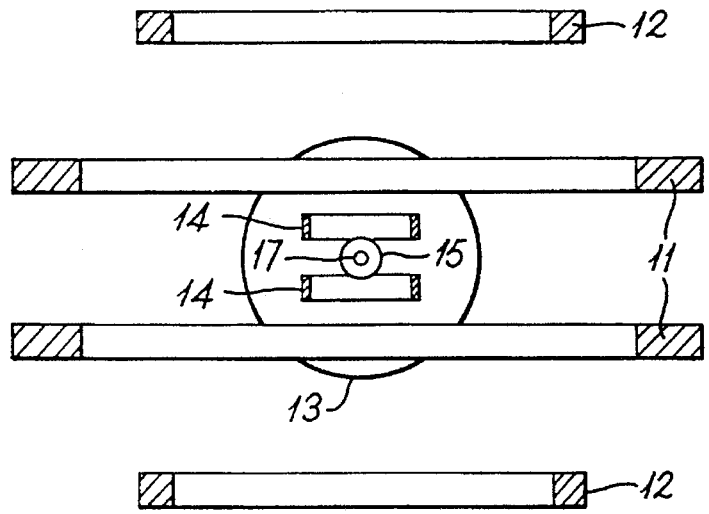
FIG. 1 is a representation of the magnetizing coils and an NMR transmit/receive coil of a whole-body NMR scanning apparatus of known kind, with the addition of an EPR resonator.

As shown in FIG. 1, whole-body NMR scanning apparatus of known kind comprises four coaxially arranged coils for generating a steady $B_o$ vertical magnetic field, namely a large main pair of coils 11 and a smaller pair of outer coils 12, together with gradient coils (not shown in detail) which are located in known manner on a gradient coil tube 13 of which the axis is perpendicular to that of the coils 11 and 12. In order to adapt this known arrangement for performing field-cycling NMR there are provided a further pair of smaller coils 14 coaxial with the coils 11 and 12 and located symmetrically between the coils 11.

Figure 2:
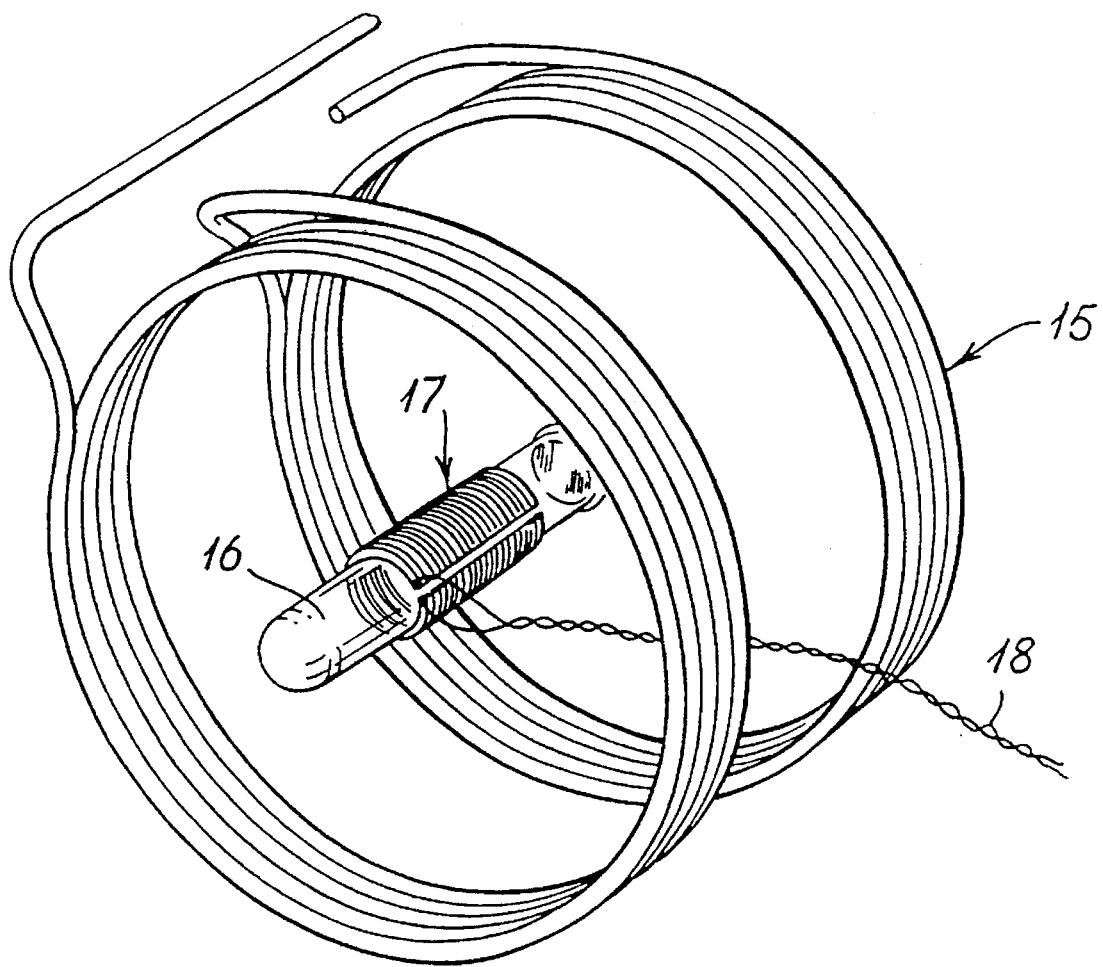
FIG. 2 shows, on a larger scale, the NMR transmit/receive coil and EPR resonator shown in FIG. 1, together with a container for a sample which is to be examined.

At the center of the apparatus, i.e. where the axis of the gradient coil tube 13 intersects that of the coils 11 and 12, a transmit/receive NMR signal coil 15 is located coaxial with the gradient coil tube 13, and, as shown in FIG. 2, a tube 16 for containing a sample which is to be examined is disposed coaxially within the coil 15. Surrounding the tube 16 is an EPR resonator 17 consisting of twenty loops connected in parallel to energizing leads 18 connected to an EPR excitation signal generator (not shown) comprising a synthesized microwave frequency generator driving a broadband amplifier to whose output the leads 18 are connected. Suitable trimming capacitors (not shown) are included for tuning the resonator 17 to the appropriate EPR frequency and matching it to the leads 18. The illustrated resonator 17 could, if desired, be replaced by a so-called birdcage resonator, or loop-gap resonator, or Alderman-Grant resonator, of known kind.

In a particular embodiment of apparatus as above described which has been used for carrying out the methods disclosed in the above-mentioned international patent application and according to the invention, the coils 11 and 12, which are energised so that their fields are additive, were arranged to provide a steady $B_o$ magnetic field of 0.01 T at the center of the apparatus, giving a proton NHR frequency of 425 kHz. The coil 15, with a diameter of 85 mm, was used for transmission and reception at that frequency, being connected to a suitable RF transmitter and receiver via a passive transmit/receive switch. The coils 14, which are connected electrically in series and wound so that their magnetic fields are additive (but opposed to that generated by the coils 11 and 12, as explained below), were of air-cored water-cooled type with an internal diameter of 220 mm and an inductance of 24 mH. Each of the coils 14 had 188 turns of 2.5 mm diameter copper wire and, energized with a current of 3.67A, they produced a magnetic field of 0.0049 T at the center of the apparatus. They were energized at a selectable constant current by a constant-current power supply, and the current was switched on and off, as explained below, using MOSFET transistors under the control of the pulse programmer of the NMR apparatus. The switching time was less than 10 ms.

In carrying out the method described in the above-mentioned international patent application, with the above described apparatus, the NMR apparatus is operated in the field cycling mode in which each cycle comprises a polarization period followed by an evolution period followed in turn by a detection period. With the tube 16 containing a sample which is to be examined and which includes a possibly inhomogenously distributed solution of paramagnetic material in a solvent which contains hydrogen nuclei (protons), the nuclear magnetization of the protons is allowed to build up during the polarization period under the influence of the $B_o$ magnetic field of 0.01 T produced by the coils 11 and 12 alone, i.e. with the coils 14 unenergized. Alternatively, the coils 14 could be energized during the polarization period to generate a field in the same direction as that generated by coils 11 and 12, to produce a net magnetic field at the sample greater than 0.01 T, in turn increasing the proton magnetization. Then the coils 14 are energized to generate a field opposed to that generated by the coils 11 and 12 so that (as shown by the top line of FIG. 3) the net magnitude of the $B_o$ field quickly falls from 0.01 T to (in a particular case) only 0.005T, at which level it then remains during the evolution period of the cycle.

Figure 3:
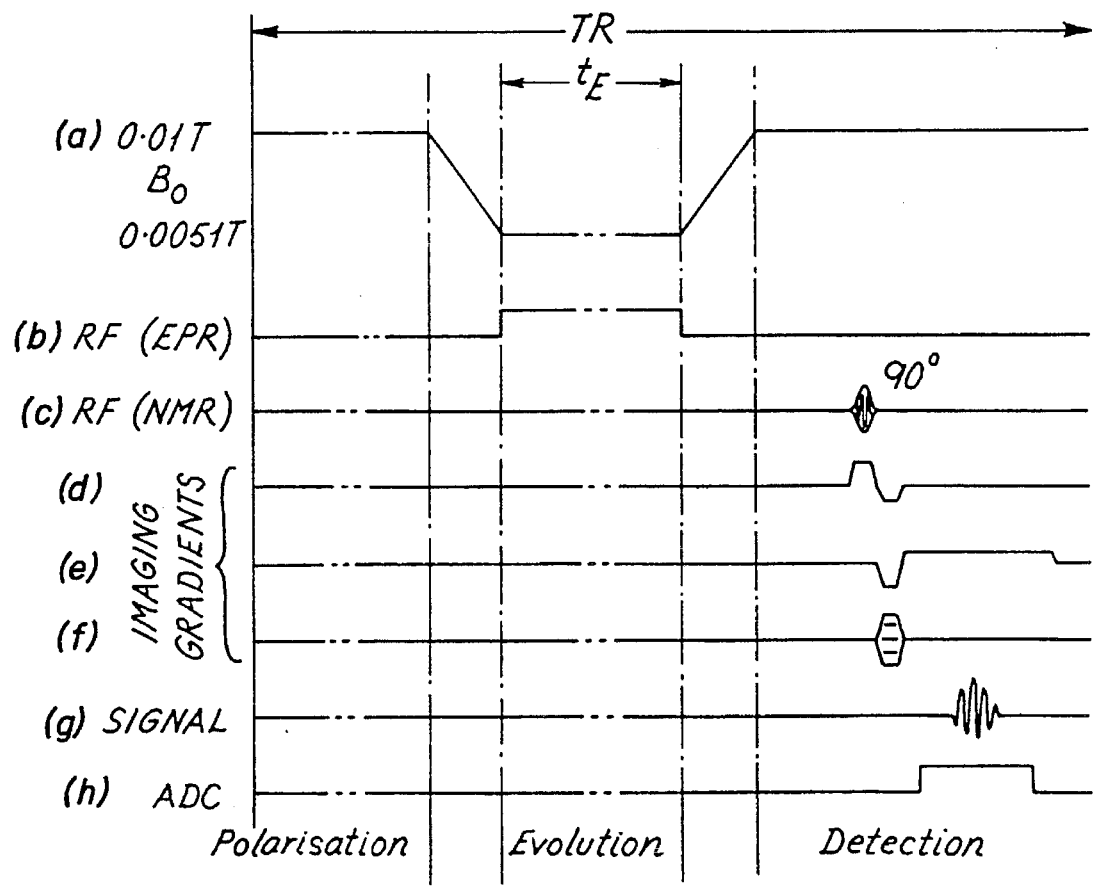
FIG. 3 is a diagram showing the relative timings of events during one cycle of the field cycling NMR method, which may be applied by means of the apparatus shown in FIGS. 1 and 2, which is disclosed in our pending international patent application WO 92/04640.

During this evolution period, as shown in waveform (b) of FIG. 3, an EPR excitation signal is applied to the EPR resonator 17. In a particular case, where the sample being examined was a phantom containing a 2 mM aqueous solution of the nitroxide free radical TEMPOL (4-hydroxy-2,2,6,6-tetramethylpiperidine-i-oxyl) at room temperature, the EPR irradiation frequency was fixed at 160 MHz at a power level of 1 watt, and the examination was carried out by irradiating one of the characteristic EPR lines of the nitroxide triplet which were observed at $B_o$ values of 0.0037 T, 0.0051 T and 0.0072 T, these values of $B_o^e$ being obtained by suitable selection of the constant current applied to the coils 14. The intermediate resonance, at 0.0051 T, was used for most experiments.

The evolution period is then terminated by switching off both the EPR resonator and the coils 14, so that the $B_o$ field quickly resumes its value of 0.01 T for the ensuing detection period of the cycle. Alternatively, the current supplied to the coils could be reduced, rather than switched off completely, so as to provide during the detection period a field $B_o^d$ greater than the evolution period field $B_o^e$ but still less than the field $B_o^p$ provided during the initial polarisation period.

During the detection period, in normal NMR manner, a radio frequency NMR interrogation signal is applied to the coil 15 (as shown by waveform (c) in FIG. 3) and gradient field signals are applied to the gradient coils (as indicated by waveforms (d) to (f) of FIG. 3). This results in an output NHR image signal (represented in waveform (a) of FIG. 3) which is detected by the coil 15. As already mentioned, parts of this signal which are due to protons which have interacted with adjacent excited paramagnetic material are enhanced, so that the corresponding parts of the final image obtained are also of enhanced intensity and the final image then indicates the distribution of excited paramagnetic material in the sample being examined.

It will be understood that, by carrying out the EPR excitation only during the evolution period, while the $B_o$ field has its low value of $B_o^e$, the required power level of the EPR excitation irradiation is minimized and that this is achieved without compromising the output image signal SNR which is determined by the higher value of the $B_o$ field during the other periods of the cycle.

In principle, the reduction of the $B_o$ field during the evolution period could be achieved by reducing the energizing current of the coils 11 and 12, but in practice that would probably place unacceptable demands on the coil power supply and coil insulation due to the large inductance of the coils. It is therefore preferred to use the above described "field compensation technique" in which the coils 11 and 12 are maintained at constant current and the field varied by switching on and off only the much smaller coils 14. It is preferred that the coils 14 are switched off during the detection period rather than operated at reduced current, since then the $B_o$ field is provided only by the coils 11 and 12 during the detection period, when the greatest demands are placed on the spatial homogeneity and temporal stability of the magnetic field at the sample. The homogeneity of the magnetic field during the evolution period need only be good enough to irradiate the EPR line of interest throughout the sample: in the conditions described above, the linewidth was more than 4 MHz at an EPR frequency of 160 MHz so that a variation of $B_o^e$ of more than ±1% over the sample volume could be tolerated, while the calculated homogeneity of the coils 14 was better than ±1000 ppm over the sample volume. The disadvantage of field compensation is the inevitable interaction between the coils 11 and 14 caused by their close proximity: it was found that this gave rise to an instability of the magnetic field due to coils 11 and 12 when the current in the coils 14 was switched. The effect became more serious as the field strengths were increased, and it was for that reason that the values of $B_o^p$ and $B_o^d$ were restricted to an upper limit of 0.01 T.

It will be appreciated that one cycle of the method described above provides insufficient data for constructing a complete NMR image, and that to obtain an image with, say, 32×32 pixels it is necessary to carry out at least 32 cycles of the method. This involves 32 periods of irradiation of the object under examination with the EPR excitation RF signal during the 32 evolution periods. If a higher-resolution image is to be collected, with say 128×128 or 256×256 pixel is, the number of cycles (and thus the number of EPR excitation irradiations, is correspondingly increased.

Figure 4:
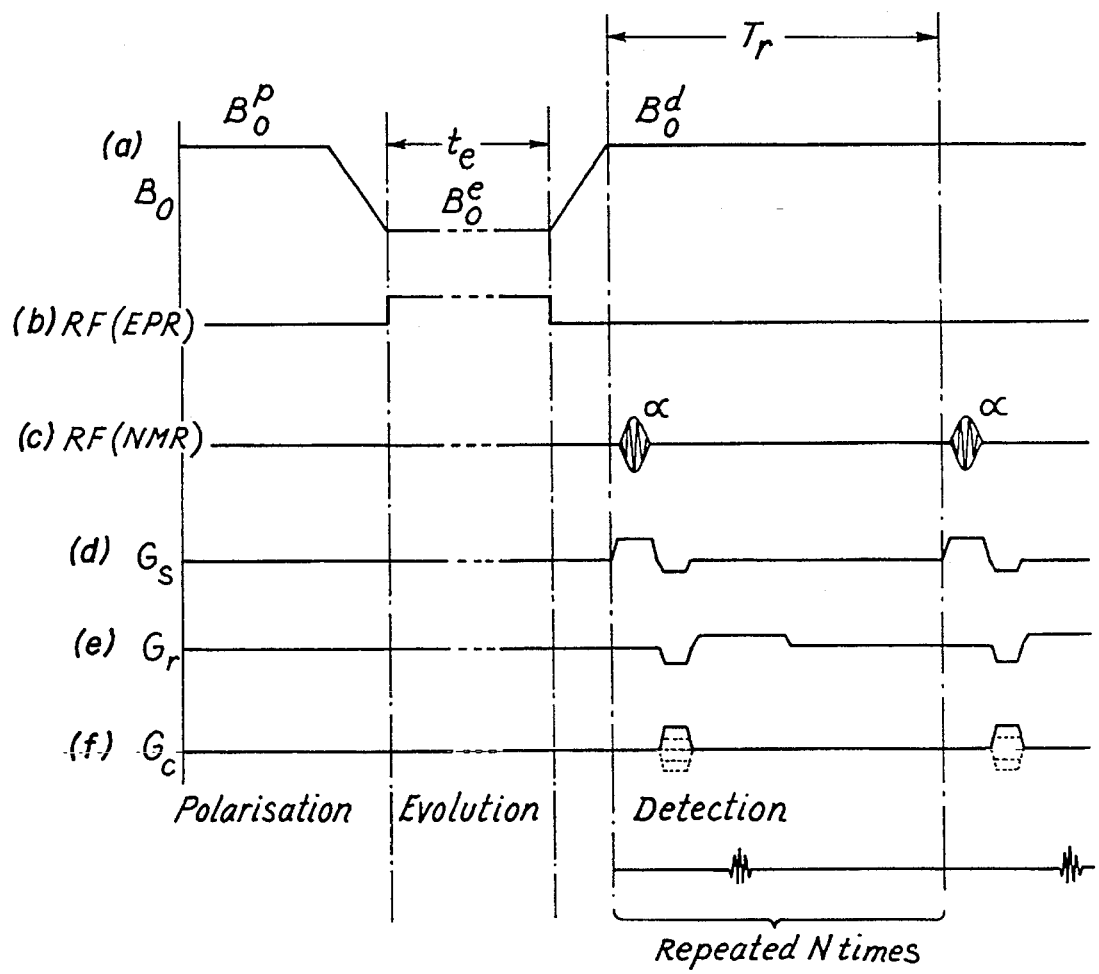
FIG. 4 is a corresponding diagram of events during one cycle in a preferred version of the method according to the present invention which also incorporates field cycling.

In accordance, however, with the method of the present invention, which may be carried out using the apparatus described with reference to FIGS. 1 and 2, each EPR irradiation is followed by the whole series of NMR interrogations and resulting NMR image signals which are required in order to construct the complete image. This is illustrated by FIG. 4, which relates to the preferred form of the invention which also incorporates field-cycling. Accordingly the left sides of FIGS. 3 and 4 are identical, showing an initial polarization period during-which the $B_o$ field has its higher value of $B_o^p$ followed by the single evolution period of EPR irradiation lasting for a time interval $t_e$ of, typically, 1–2s during which the $B_o$ field has its reduced value of $B_o^e$. Then however after a short delay of typically, 10 ms during which the $B_o$ field is restored to a higher value, $B_o^d$, the detection period contains a whole series of NMR radiofrequency interrogation signals, each in association with its own appropriate $G_c$ gradient field in order to produce all the NMR image signals required for constructing the complete NMR image. For a 32×32 image, the detection cycle will be repeated 32 times during the detection period, with a repetition time $T_r$ of 5–20 ms.

Provided all the image data can be obtained in a time of the order of the proton $T_1$ of the object under examination, the decay of the enhancement during data acquisition will not adversely affect the images. Since most of the image information is contained in the data obtained in the zero- and weak phase-encoding data acquisitions, corresponding to low spatial frequencies in the object under examination, it is advantageous to commence with the zero phase-encoding acquisition and thereafter to increase the amplitude of the phase-encoding gradient pulse while alternating the sign. In practice, it is found preferable to repeat the detection cycle more than the strictly required number of times, the first few (typically five) cycles being treated as dummy NMR excitations, from which no output NMR signals are collected, in order to ensure that a dynamic equilibrium or steady state has been achieved before the commencement of data acquisition.

It may be advantageous to perform the experiment as described above, with the EPR irradiation applied during the evolution period at a frequency determined by $B_o^e$, applying the EPR irradiation again during the whole of the detection period, at a greater frequency determined by $B_o^d$, to reduce the amount of signal decay during the detection period. It may also be advantageous to switch off the EPR irradiation during the short periods when the NMR signals are being sampled by the ADC, to avoid noise caused by breakthrough of the EPR irradiation into the NMR receiver.

Since the data acquisition for one image is collected very rapidly, a substantial wait (of several minutes if desired) can be tolerated. Conceivably, therefore, relatively large instantaneous power levels of the EPR radio-frequency irradiation applied during the evolution period could be employed in order to maximize the enhancement, without danger of overheating the object under examination.

It will be understood that, as in the method described with reference to FIG. 3, the method according to the present invention may also include the additional steps of obtaining an unenhanced NHR image signal by proceeding as above described but without exciting EPR resonance, and then deriving image information representing the difference between the enhanced and unenhanced image signals.

Although the version of the method according to the invention described above includes field cycling of the $B_o$ magnetizing field, it will be understood that this is not a necessary element. In experiments using the method as shown in FIG. 4, the value of the $B_o$ field was reduced from 0.01 T for $B_o^p$ and $B_o^d$ to 0.0051 T for $B_o^e$, and the required EPR frequency applied during the evolution period was 160 MHz. In similar experiments not using field cycling, in which the value of $B_o$ was maintained at 0.01 T even during application of the EPR excitation, a higher EPR frequency of 237 MHz was required, at higher power, in order to excite resonance.

In the version of the method not involving cycling of the $B_o$ magnetizing field, it is advantageous to continue the EPR irradiation during the whole of the detection period, thus avoiding any decay of the enhanced nuclear magnetization. In this case, it may be advantageous to switch off the EPR irradiation during the short periods when the NMR signals are being sampled by the ADC, to avoid noise caused by break-through of the EPR irradiation into the NMR receiver.

A further potential advantage of using field cycling in combination with the present invention is that, since only one cycle of field cycling is needed per complete image, it may be possible to use simplified power supplies for the field-cycling magnet as compared with what is required for practicing the field-cycling method illustrated in FIG. 3. This could be of particular advantage in a whole-body imager where field cycling is much more difficult due to the increased field energy of the large magnets involved.

It should be noted that the principle of the present invention, which we call snapshot PEDRI (i.e. the application of only one ESR irradiation per image) can be applied using any of the recently-developed snapshot imaging techniques (FLASH, RARE, etc.). In principle, the technique could also be used with echo-planar imaging (EPI), where only one NMR excitation is needed per image, and the image data are acquired in less than 100 ms. However, Snapshot Field-Cycled PEDRI using EPI would probably be difficult, since it may not be possible to stabilize the magnetic field sufficiently well during the detection period, resulting in image artifacts.

We claim:

1. A method of proton-electron double-resonance magnetic resonance imaging comprising steps of:
   subjecting a sample containing paramagnetic material to a polarizing magnetic field during a polarization period;
   subjecting said sample to an evolution period after said polarization period, said evolution period comprising a step of subjecting said sample to radio-frequency radiation at a frequency in correspondence with a respective polarizing magnetic field, so as to excite electron paramagnetic resonance in said paramagnetic material;
   subjecting said sample to a detection period after said evolution period, said detection period including steps of:
     subjecting said sample to a plurality of nuclear magnetic resonance interrogating signals,
     deriving a corresponding plurality of nuclear magnetic resonance image signals from said sample subjected to said plurality of nuclear magnetic resonance interrogating signals, and
     combining said plurality of nuclear magnetic resonance image signals into a complete nuclear magnetic resonance image.

2. A method according to claim 1, comprising further steps of:
   applying said polarizing magnetic field to said sample at a steady first value during said polarization period;
   reducing said polarizing magnetic field to a second value lower than said first value during said evolution period; and
   increasing said polarizing magnetic field to a third value greater than said second value during said detection period.

3. A method according to claim 2, wherein:
   said third value of said polarizing magnetic field is equal to or less than said first value of said polarizing magnetic field.

4. A method according to claim 1, 2 or 3, wherein:
   a first few of said plurality of nuclear magnetic resonance interrogating signals to which said sample is subjected during said detection period establish at least one of a dynamic equilibrium and steady state of said sample wherein no nuclear magnetic resonance image signals corresponding to said first few of said plurality of nuclear magnetic resonance interrogating signals are collected, said corresponding plurality of nuclear magnetic resonance image signals being derived only from subsequent ones of said plurality of nuclear magnetic resonance interrogating signals subsequent to said first few of said plurality of nuclear magnetic resonance interrogating signals.

5. A method according to claim 1, 2 or 3, wherein:
   said radio-frequency irradiation applied during said evolution period to excite electron paramagnetic resonance is also applied, at a frequency corresponding to a respective magnetic field, during said detection period.

6. A method of proton-electron double-resonance magnetic resonance imaging comprising steps of:
   subjecting a sample containing paramagnetic material to a first polarizing magnetic field during a polarization period;
   subjecting said sample to a second polarizing magnetic field lower than said first polarizing magnetic field during an evolution period after said polarization period, said evolution period comprising a step of subjecting said sample to radio-frequency radiation at a frequency which excites electron paramagnetic resonance in said paramagnetic material;
   subjecting said sample to a continuous third polarizing magnetic field different from said second polarizing magnetic field during a single detection period after said evolution period, said single detection period including steps of:
     subjecting said sample to a plurality of nuclear magnetic resonance interrogating signals,
     deriving a corresponding plurality of nuclear magnetic resonance image signals from said sample subjected to said plurality of nuclear magnetic resonance interrogating signals, and
     combining said plurality of nuclear magnetic resonance image signals into a complete nuclear magnetic resonance image.

7. A method of proton-electron double-resonance magnetic resonance imaging comprising steps of:
   subjecting a sample containing paramagnetic material to a polarizing magnetic field during a polarization period;
   subjecting said sample to said polarizing magnetic field during an evolution period after said polarization period, said evolution period comprising a step of subjecting said sample to radio-frequency radiation at a frequency which excites electron paramagnetic resonance in said paramagnetic material; and
   subjecting said sample to said polarizing magnetic field and said radio-frequency radiation during a single detection period after said evolution period, said single detection period including steps of:

subjecting said sample to a plurality of nuclear magnetic resonance interrogating signals,
deriving a corresponding plurality of nuclear magnetic resonance image signals from said sample subjected to said plurality of nuclear magnetic resonance interrogating signals, and
combining said plurality of nuclear magnetic resonance image signals into a complete nuclear magnetic resonance image;

said polarizing magnetic field not being cycled between said evolution period and said single detection period; and said electron paramagnetic resonance being excited during said evolution period and during said detection period.

* * * * *